(12) United States Patent
Chen

(10) Patent No.: US 6,776,224 B1
(45) Date of Patent: Aug. 17, 2004

(54) HEATING DISSIPATING DEVICE FOR ELECTRONIC ELEMENTS

(76) Inventor: Shin Ming Chen, 235 Chung-Ho Box 8-24, Taipei (TW)

( * ) Notice: Subject to any disclaimer, the term of this patent is extended or adjusted under 35 U.S.C. 154(b) by 0 days.

(21) Appl. No.: 10/448,276

(22) Filed: May 30, 2003

(51) Int. Cl.[7] .................................................. F28F 7/00
(52) U.S. Cl. ...................... 165/80.3; 165/185; 361/697; 361/704; 257/706; 257/722; 174/16.3
(58) Field of Search ................................ 165/80.3, 185; 361/697, 703, 704, 702, 711; 174/16.3; 257/706, 722

(56) References Cited

U.S. PATENT DOCUMENTS

| | | | | |
|---|---|---|---|---|
| 5,771,966 A | * | 6/1998 | Jacoby | 165/185 |
| 5,964,285 A | * | 10/1999 | Huang | 165/185 |
| 6,009,937 A | * | 1/2000 | Gonner et al. | 165/185 |
| 6,176,304 B1 | * | 1/2001 | Lee | 165/185 |
| 6,263,956 B1 | * | 7/2001 | Tang et al. | 165/80.3 |
| 2003/0094275 A1 | * | 5/2003 | Mochizuki et al. | 165/185 |

* cited by examiner

*Primary Examiner*—Terrell McKinnon

(57) ABSTRACT

A heating dissipating device for electronic elements comprises a bottom plate and a plurality of heat dissipating sheets; the bottom plate being formed with a plurality of grooves. A lower end of each heat dissipating sheet is a folded end and the folded end is inserted into a respective groove to be fixed therein tightly. Each groove may be inclined with respect to the surface of the bottom plate and the fold end is also inclined. Moreover, two sides of the bottom plate are punched so that the heat dissipating sheets are tightly engaged to the bottom plate.

4 Claims, 9 Drawing Sheets

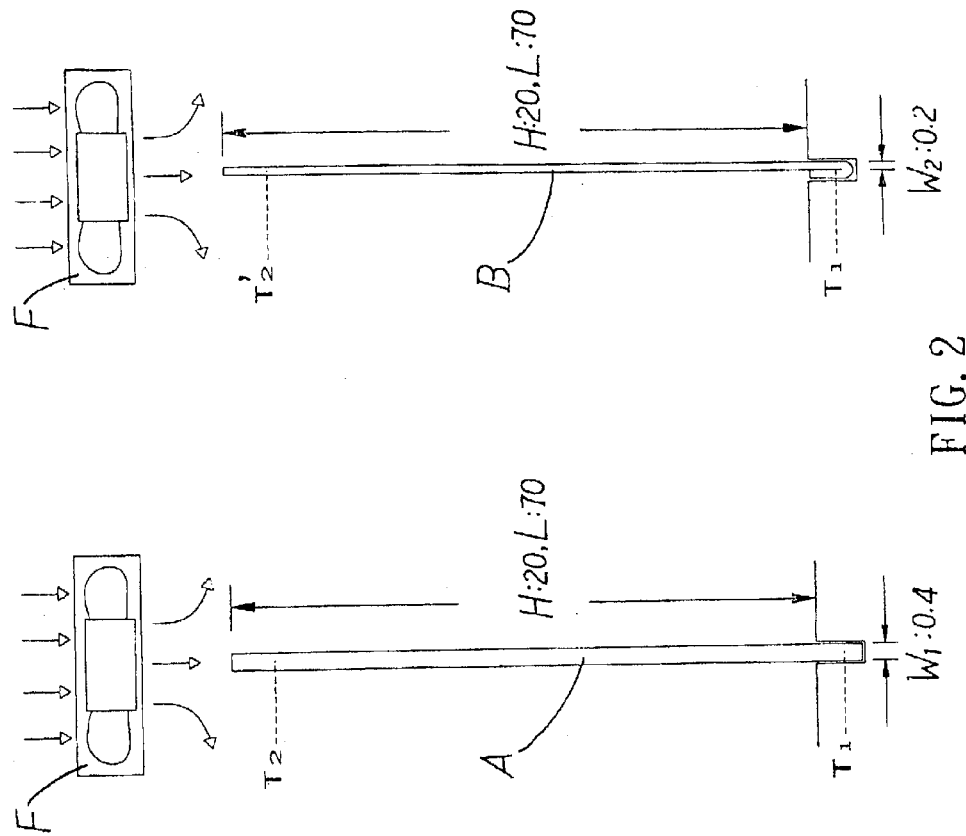
FIG. 2 2A PRIOR ART 2B PRIOR ART
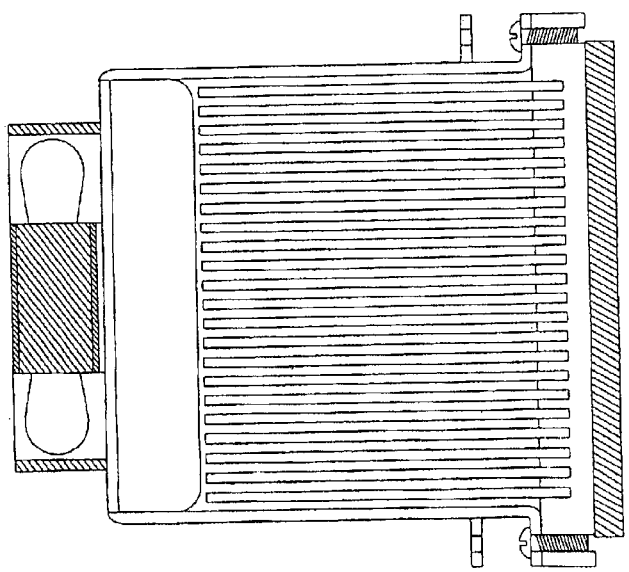
FIG. 1-1 PRIOR ART

HEATING DISSIPATING DEVICE FOR ELECTRONIC ELEMENTS

FIELD OF THE INVENTION

The present invention relates to heating dissipating devices, and particularly to a heating dissipating device for electronic elements, wherein one end of the heat dissipating sheet is folded to be wider and then the end is fixed to the bottom plate so that the heat dissipating ability is increased.

BACKGROUND OF INVENTION

Current electronic devices need many high efficiency heating dissipating devices due to the operation speed increment of the electronic devices. Referring to FIGS. 1 and 1—1, it is illustrated that the prior art heating dissipating device, where a fin device with a plurality of heat dissipating sheets is locked to a fan and a bottom at two sides. The bottom plate is used to contact with the electronic device for dissipating heat. The heat dissipating capacity is confined by the number of the fins embedded in the bottom plate and thus the more the fins, the better the heat dissipating ability. Since the sizes of the electronic devices are made more and more compact, the heating dissipating devices must have higher efficiency for dissipating heat. Thereby, it is necessary to implant heat dissipating sheets into a bottom plate as many as possible. However, this is confined by the cutting steel sheets for forming grooves on the bottom plate. The width of the steel sheet is confined. If the steel sheet for cutting the bottom plate to form grooves is too narrow, the steel piece will break. Thereby, the conventional way has a limit in embedding heat dissipating sheets to the bottom plate and thus the heating dissipating ability is confined.

SUMMARY OF THE INVENTION

Accordingly, the primary object of the present invention is to provide a heating dissipating device for electronic elements which comprises a bottom plate and a plurality of heat dissipating sheets; the bottom plate being formed with a plurality of grooves. A lower end of each heat dissipating sheet is a folded end and the folded end is inserted into a respective groove to be fixed therein tightly.

Another object of the present invention is to provide a heating dissipating device for electronic elements, wherein each groove may be inclined with respect to the surface of the bottom plate and the fold end is also inclined.

A further object of the present invention is to provide a heating dissipating device for electronic elements, wherein the fold end can have different configurations so that the heat dissipating sheets con be designed with different configurations.

The various objects and advantages of the present invention will be more readily understood from the following detailed description when read in conjunction with the appended drawing.

BRIEF DESCRIPTION OF THE DRAWINGS

FIG. 2 shows the assembly of a heat dissipating sheet to a bottom plate, where 2A is a prior art case and 2B is a case of the present invention.

DETAILED DESCRIPTION OF THE INVENTION

Figure 1:
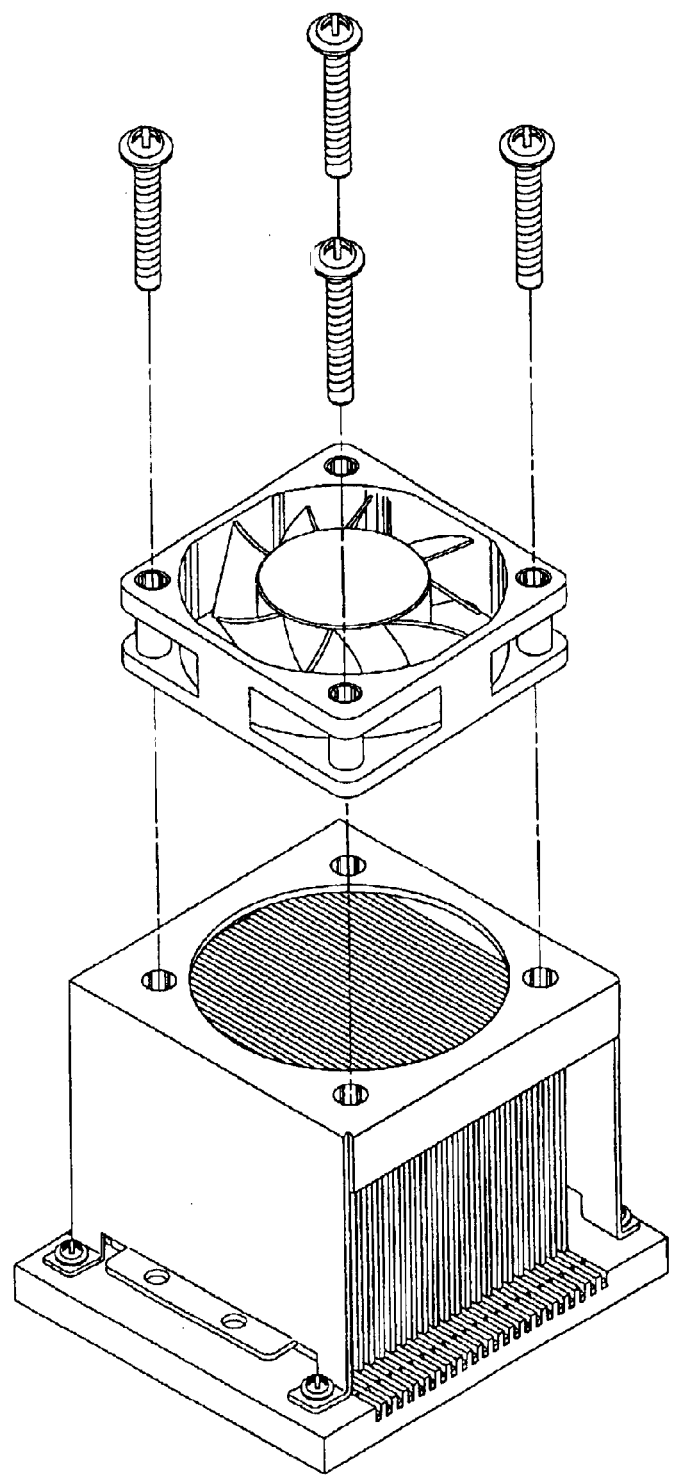
FIG. 1 is a schematic view of a prior art heating dissipating device and FIG. 1—1 is an assembled lateral view of the prior art.

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

With reference to FIG. 2, schematic views showing the prior art and the present invention are illustrated in FIG. 2A and 2B, respectively. In the drawings, the heat dissipating sheets A and B have the same length L and the height H, where L is 70 mm and height is 20 mm. The heat dissipating sheet A has a width W1 of 0.4 mm and B has a width W2 of 0.2 mm. Thereby, the difference of the heating dissipating areas of heat dissipating sheets A and B is very small, even it can be neglected. The heat dissipating sheets A aid B are installed to respective grooves in a bottom plate. The two grooves have equal widths and thus have the same contact area and thus the heat flow rates from the bottom plates to the heat dissipating sheets A and B are equal. Heat flow rate can be calculated by the formula, $H=KAr(T2-T1)/H$, where K is heat conductivity, for example, for copper, K is equal to 0.92; Ar is the heating dissipating area of the heat dissipating sheet; T1 is the contact temperature of the bottom plate; and T2 is temperature of the end section of the heat dissipating sheet A or B (temperature of the heat dissipating sheet is changed monotonically with the distance from the end section of the heat dissipating sheet). Thereby, it is shown that the heat flow rates of the heat dissipating sheets A and B are almost equal to one another.

Moreover, for heat capacity, $Q=mC(T2-T1)$, where m is the mass of the heat dissipating sheet; C is specific heat; T1 is the contact temperature of the bottom plate; and T2 is temperature of the end section of the heat dissipating sheet A or B. Since mass of the heat dissipating sheet A is twice of that of heat dissipating sheet B and thus the heat capacity of heat dissipating sheet A is twice of that of heat dissipating sheet B. Therefore, as wind blows the heat dissipating sheets A and B, the temperature of heat dissipating sheet B will descend more rapidly than that of heat dissipating sheet A, and thus B is a larger temperature gradient. Thus temperature differenced of heat dissipating sheet B is larger than heat dissipating sheet A. Heat flow rate is positively proportional to temperature difference. Thus, heat dissipating sheet has a preferred heating dissipating efficiency.

Figure 3:
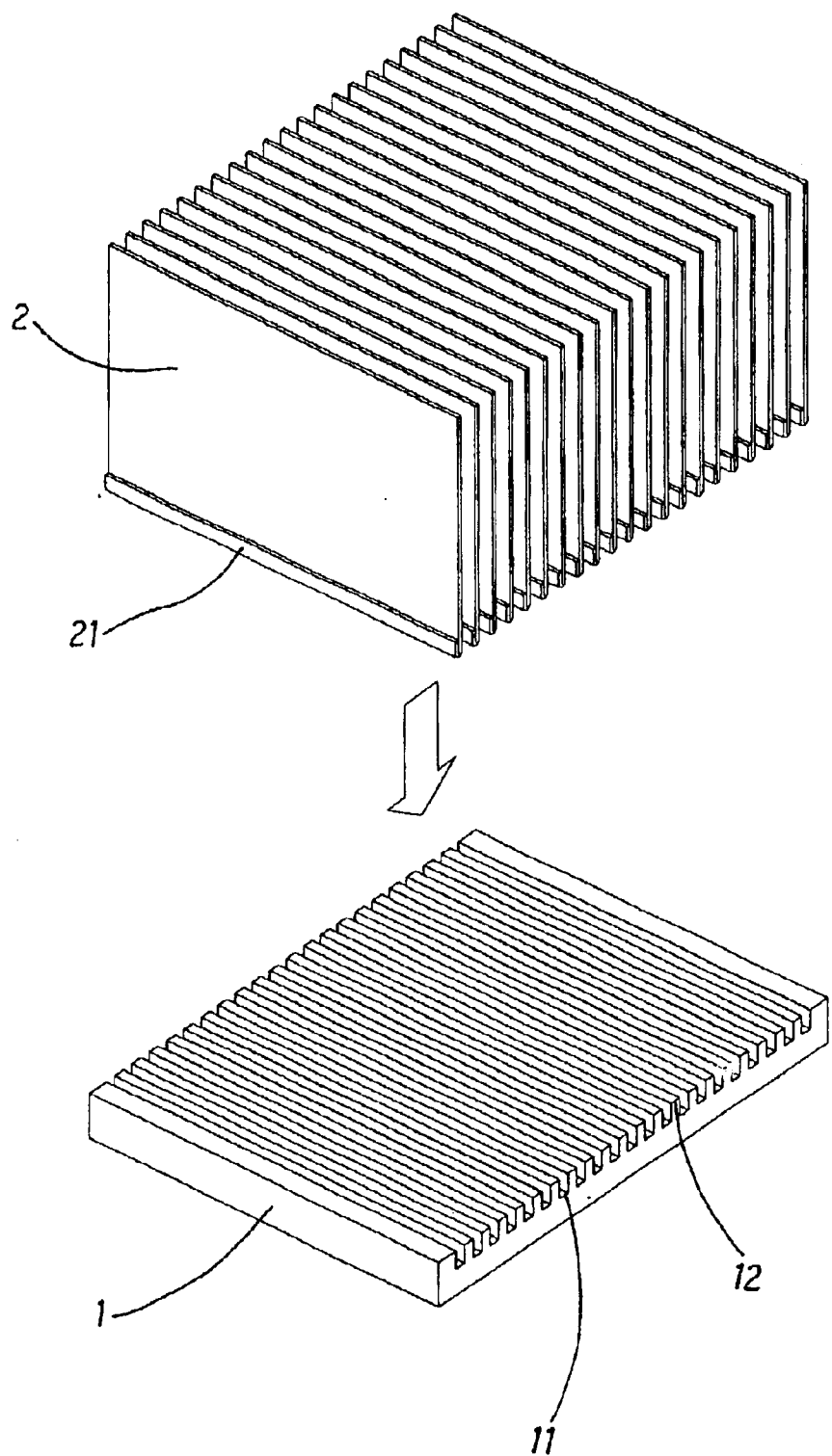
FIG. 3 is an exploded perspective view of the present invention.
Figure 5:
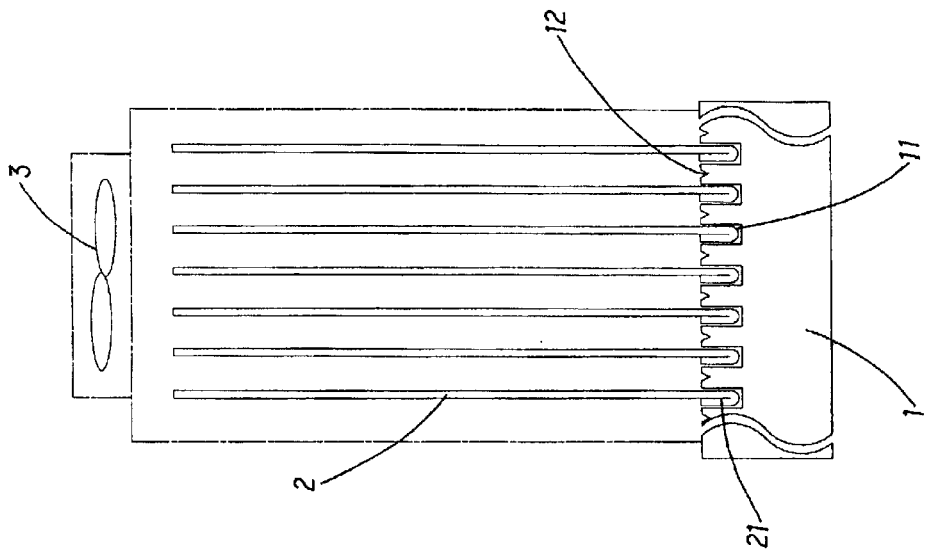
FIG. 5 is a cross sectional view of the present invention, where a fan is installed above the heat dissipating sheets.
Figure 4:
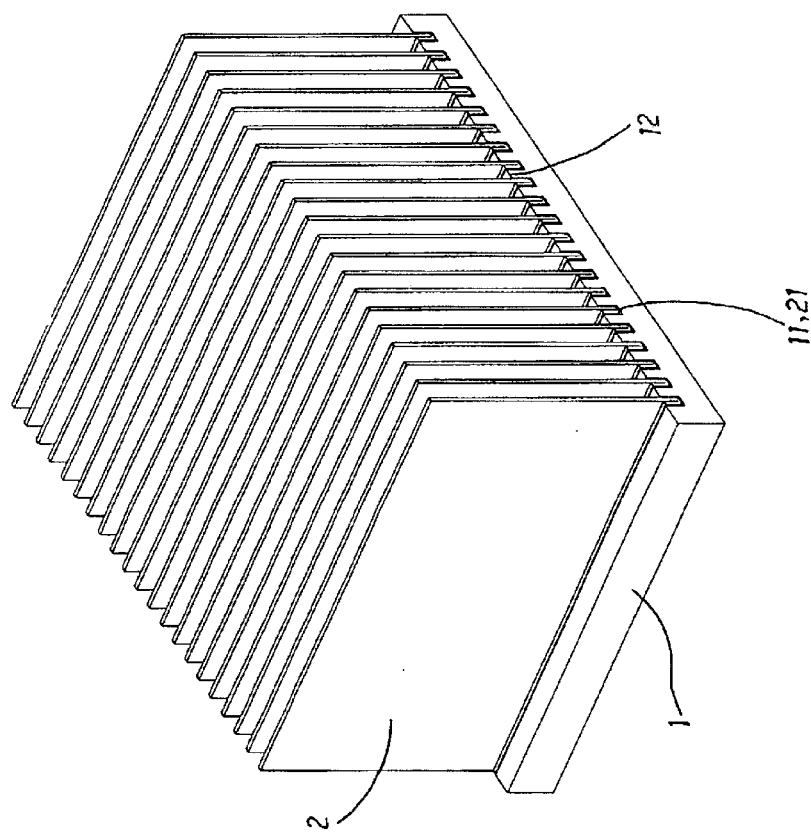
FIG. 4 is an assembly schematic view of the present invention.

In the following, the structure of the present invention will be described, With reference to FIGS. 3 to 5, the present invention includes a bottom plate 1 and a plurality of heat dissipating sheets 2. The surface of the bottom, plate 1 has a plurality of grooves 11 (which may has a minimum size allowable in the specification). An end surface 12 is formed between two adjacent grooves. A lower end of each heat dissipating sheet 2 can be inserted into the groove 11 by tightly engagement. An end surface of each heat dissipating sheet 2 inserted into the groove 11 has a reverse fold 21. Thereby, the lower end of each heat dissipating sheet 2 has an optimum contact area with respect to the groove 11 so that heat of the bottom plate 1 can be transferred to the heat dissipating sheets 2 rapidly. The width of each heat dissipating sheets 2 is one half of the groove 11, but the reverse fold 21 is exactly received in the groove 11. Thereby from the discussion above, it is known that the heat dissipating sheets 2 of the present invention have preferred heating dissipating efficiency than those have a width equal to the width of the groove 11 when a fan 3 is used to blow wind to the heat dissipating sheets 2.

Figure 6:
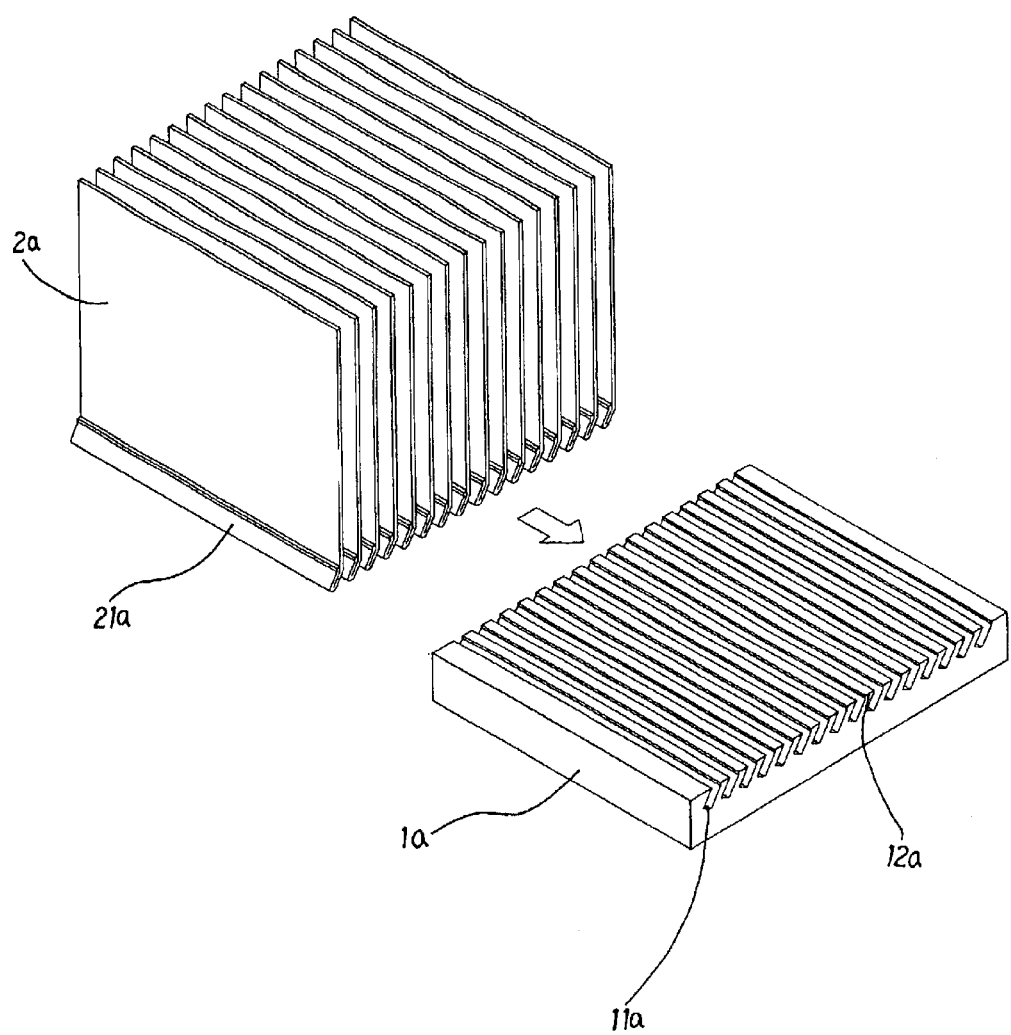
FIG. 6 is an exploded perspective view of the present invention, wherein the grooves are inclined.
Figure 8:
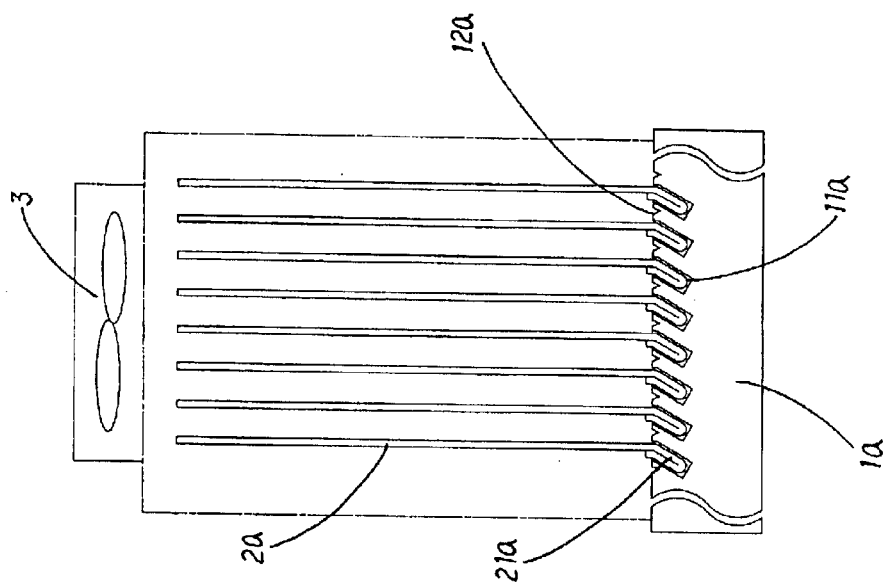
FIG. 8 is an assembled cross sectional view of the present invention, wherein a fan is added.
Figure 7:
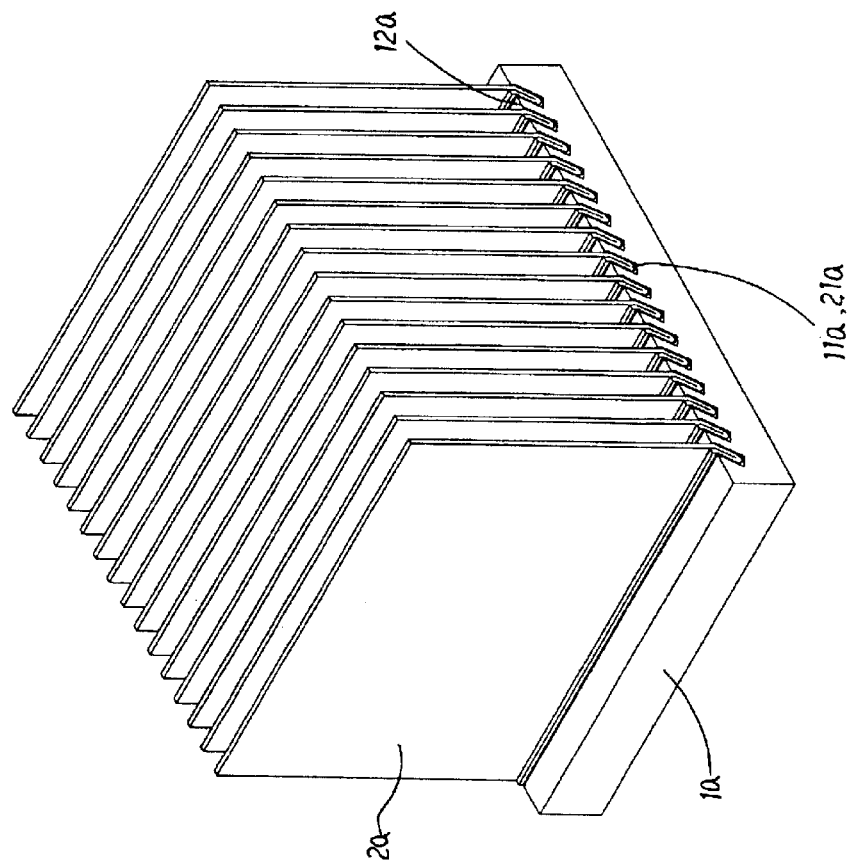
FIG. 7 is an assembly schematic view of FIG. 6.

With reference to FIGS. 6 to 8, it is illustrated that a plurality of inclined grooves 11a are formed in the bottom plate 1a. Each two grooves 11a are spaced by an end surface 12a. A lower end of each heat dissipating sheet 2a has an inclined reverse fold 21a, thereby, the heat dissipating sheets 2a can be inserted into the inclined grooves 11a. Then the two sides of the bottom plate 1a are punched so that the heat dissipating sheets 2a are tightly engaged to the bottom plate 1a.

Figure 9:
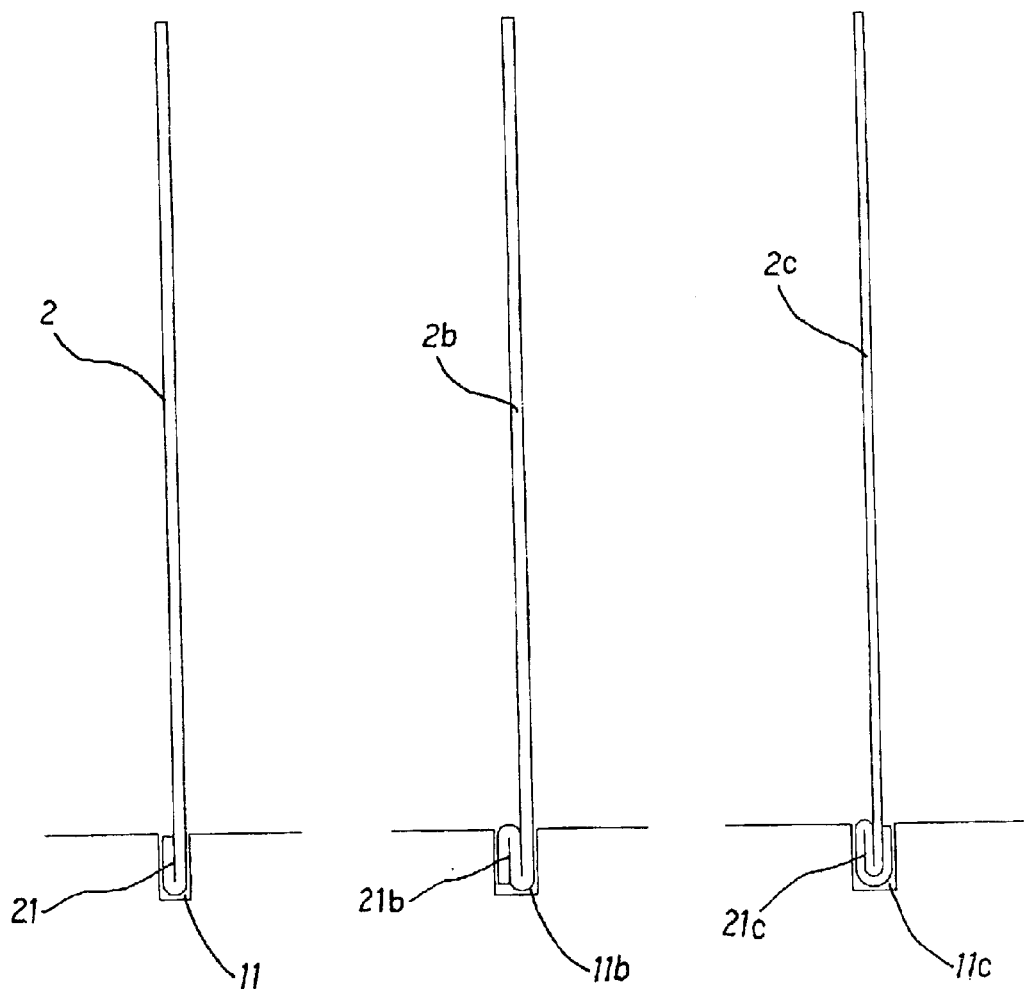
FIG. 9 shows another embodiment of the present invention.

Referring to FIG. 9, another embodiment of the present invention is illustrated. In this embodiment, the heat dissipating sheet 2b has a two-fold end surface 21b and the heat dissipating sheets 2c has a three-fold end surface 21c. The heat dissipating sheets 2b (2c) is fixedly inserted into the groove 11b (11c). Thereby, the width of the heat dissipating sheet 2b (2c) is reduced further so as to match the requirement of different integrated circuit.

Figure 10:
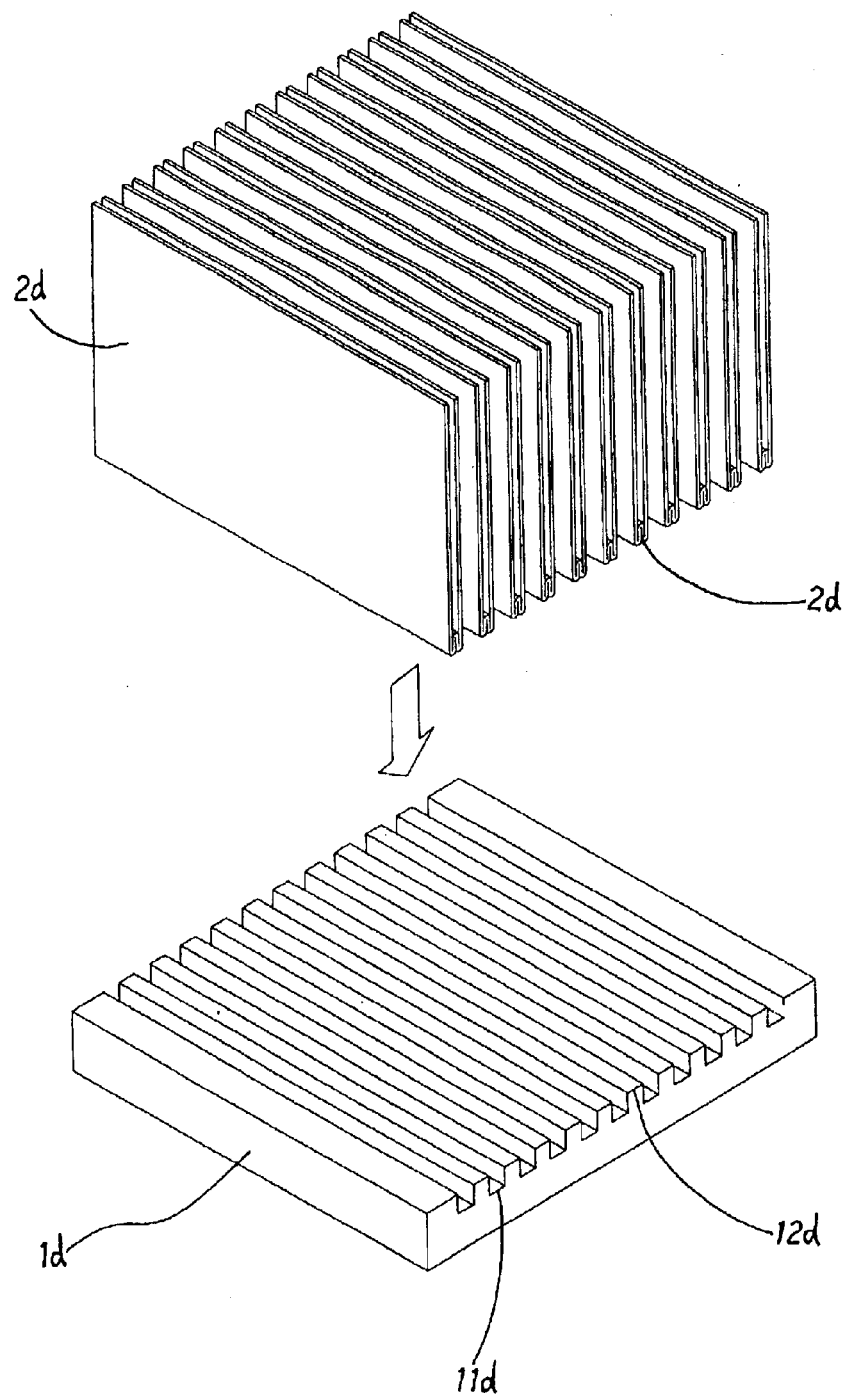
FIG. 10 shows a further embodiment of the present invention.
Figure 12:
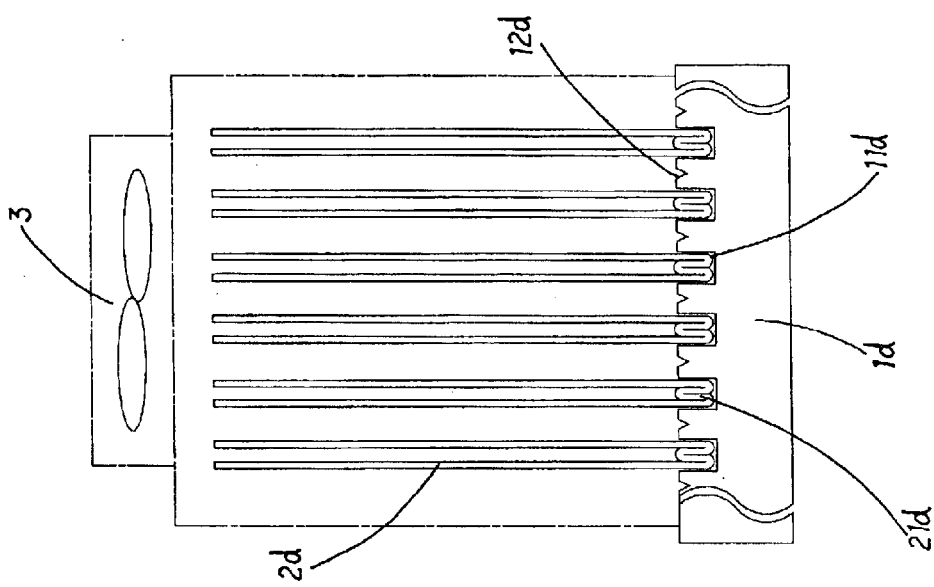
FIG. 12 shows yet an embodiment of the present invention.
Figure 11:
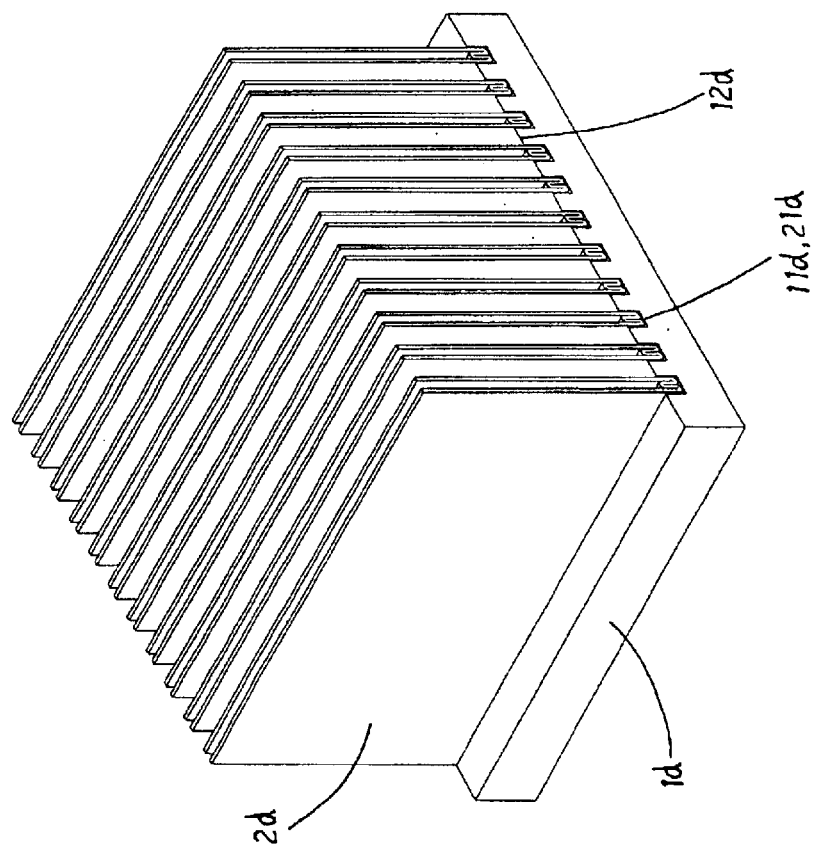
FIG. 11 shows still an embodiment of the present invention.

With reference to FIGS. 10 to 12, another embodiment of the present invention is illustrated. It is illustrated that the heat dissipating sheet 2d has a fold portion 21d. The fold portion 21d is firstly revered folded to a height approximately equal to the height of the groove 11d and then is further reversely folded to the bottom of the groove 11d, then it is further reversed folded so that two ends of the heat dissipating sheet 2 have approximately the same height. By above structure, the present invention has a preferred heat dissipating efficiency.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A heating dissipating device for electronic elements comprising a bottom plate and a plurality of heat dissipating sheets; the bottom plate being formed with a plurality of grooves; characterized in that:
   a lower end of each heat dissipating sheet is a folded end and the folded end is inserted into a respective groove to be fixed therein tightly;
   wherein each groove is inclined with respect to a surface of the bottom plate and the fold end is also inclined.

2. A heating dissipating device for electronic elements comprising a bottom plate and a plurality of heat dissipating sheets; the bottom plate being formed with a plurality of grooves; characterized in that:
   a lower end of each heat dissipating sheet is a folded end and the folded end is inserted into a respective groove to be fixed therein tightly;
   wherein the fold portion is formed by reversely folding one end of the heat dissipating sheet to a predetermined height and then the end is further folded toward a bottom of the groove.

3. A heating dissipating device for electronic elements comprising a bottom plate and a plurality of heat dissipating sheets; the bottom plate being formed with a plurality of grooves; characterized in that:
   a lower end of each heat dissipating sheet is a folded end and the folded end is inserted into a respective groove to be fixed therein tightly;
   wherein the fold portion is formed by reversely folding one end of the heat dissipating sheet to a predetermined height and then the end is further folded toward a bottom of the groove; then the end is wound around an outer side of the folded portions to another side of the heat dissipating sheet.

4. A heating dissipating device for electronic elements comprising a bottom plate and a plurality of heat dissipating sheets; the bottom plate being formed with a plurality of grooves; characterized in that:
   a lower end of each heat dissipating sheet is a folded end and the folded end is inserted into a respective groove to be fixed therein tightly;
   wherein the fold portion is formed by reversely folding one end of the heat dissipating sheet to a predetermined height and then the end is further folded toward a bottom of the groove and then, the end is folded reversely to be out of the groove so that two ends of the heat dissipating sheet have approximately equally height.

* * * * *